United States Patent
Aihara

(10) Patent No.: US 6,707,091 B2
(45) Date of Patent: Mar. 16, 2004

(54) SEMICONDUCTOR DEVICE HAVING CAPACITOR

(75) Inventor: Kazuhiro Aihara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 25 days.

(21) Appl. No.: 10/211,362

(22) Filed: Aug. 5, 2002

(65) Prior Publication Data

US 2003/0141531 A1 Jul. 31, 2003

(30) Foreign Application Priority Data

Jan. 29, 2002 (JP) ....................... 2002-020029

(51) Int. Cl.⁷ .......................................... H01L 27/108
(52) U.S. Cl. ................... 257/300; 257/296; 257/308; 257/532
(58) Field of Search .................. 257/296–313, 257/532–535

(56) References Cited

U.S. PATENT DOCUMENTS 6,441,423 B1 * 8/2002 Mandelman et al. ....... 257/301
6,458,645 B2 * 10/2002 DeBoer et al. ............. 438/240
6,507,063 B2 * 1/2003 Coolbaugh et al. ......... 257/300
6,511,873 B2 * 1/2003 Ballantine et al. .......... 438/239
6,541,811 B2 * 4/2003 Thankur et al. ............. 257/303
2002/0197831 A1 * 12/2002 Todd et al. .................. 438/528

FOREIGN PATENT DOCUMENTS

JP          5-211288      8/1993    ........... H01L/27/04

OTHER PUBLICATIONS

H.S. Rhee, et al, "Ge–Redistributed Poly–Si/SiGe Stack Gate (GRPSG) for High–Performance CMOSFETs" Symposium on VLSI Technology Digest of Technical Papers, 2001, pp. 61–62, No month given.

* cited by examiner

Primary Examiner—Allan R. Wilson
(74) Attorney, Agent, or Firm—McDermott, Will & Emery

(57) ABSTRACT

A semiconductor device having a capacitor according to the present invention has a storage node and a cell plate opposed to each other through a capacitor dielectric layer, and at least either the storage node or the cell plate is formed to have a mixed crystal layer of SiGe containing a p-type impurity. Thus, a semiconductor device having a capacitor capable of effectively preventing reduction of the capacitance can be obtained.

8 Claims, 3 Drawing Sheets

SEMICONDUCTOR DEVICE HAVING CAPACITOR

BACKGROUND OF THE INVENTION

1. Field of the Invention

The present invention relates to a semiconductor device having a capacitor, and more specifically, it relates to a semiconductor device having a capacitor including a lower electrode and an upper electrode opposed to each other through a dielectric layer.

2. Description of the Background Art

A capacitor of a DRAM (dynamic random access memory) is widely known as a capacitor employed in a semiconductor device.

FIG. 5 is a sectional view schematically showing the structure of a capacitor of a conventional DRAM. Referring to FIG. 5, the capacitor of the conventional DRAM ha a storage node flower electrode) 104, a capacitor dielectric layer 105 and a cell plate (upper electrode) 106.

The storage node 104 is electrically connected to impurity regions serving as source/drain regions formed on a silicon substrate 101 through a plug layer 102. The plug layer 102 fills up a contact hole formed in an interlayer isolation layer 103. The storage node 104 is made of polycrystalline silicon doped with phosphorus employed as an n-type impurity. The capacitor dielectric layer 105, formed to cover the storage node 104, is made of $Ta_2O_5$. The cell plate 106 is formed to be opposed to the storage node 104 through the capacitor dielectric layer 105. The cell plate 106 is made of polycrystalline silicon doped with phosphorus employed as an n-type impurity.

In the conventional DRAM, a high potential 107 is supplied to the cell plate 106 and a low potential 108 is supplied to the storage node 104 when a memory cell stores information. A large number of electrons serving as carriers are present in the n-type cell plate 106. The electrons recede from the storage node 104 having the relatively low potential 108, and hence a depletion layer having no carriers is formed in the portion of the cell plate 106 in contact with the capacitor dielectric layer 105. The depletion layer containing no carriers has insulation properties. In practice, therefore, it follows that two dielectric layers including the capacitor dielectric layer 105 and the depletion layer are present between the storage node 104 and the cell plate 106, to substantially increase the thickness of the capacitor dielectric layer 105. Thus, the quantity of charges stored in the capacitor is disadvantageously reduced.

SUMMARY OF THE INVENTION

The present invention has been proposed in order to solve the aforementioned problem, and an object thereof is to provide a semiconductor device having a capacitor capable of effectively preventing reduction of capacitance.

The semiconductor device having a capacitor according to the present invention has a capacitor including a lower electrode and an upper electrode opposed to each other through a dielectric layer, and at least either the lower electrode or the upper electrode has a mixed crystal layer of SiGe (silicon germanium) containing a p-type impurity.

In the semiconductor device having a capacitor according to the present invention, at least either the lower electrode or the upper electrode has a mixed crystal layer of SiGe. The mixed crystal layer of SiGe is a material having a smaller quantity of formation of a depletion layer than a layer of Si. Therefore, spreading of a depletion layer can be suppressed in the mixed crystal layer of SiGe for inhibiting the dielectric layer from substantial increase of the thickness, whereby the quantity of charges stored in the capacitor can be prevented from reduction.

Further, majority carriers in the electrode having the mixed crystal layer of SiGe are holes due to the p-type impurity contained therein. Also when a high potential is supplied to such a p-type electrode, therefore, no depletion layer is formed in the portion of the p-type electrode in contact with the dielectric layer. When the mixed crystal layer of SiGe containing a p-type impurity is employed for an electrode supplied with a higher potential, therefore, this electrode can be prevented from formation of a depletion layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
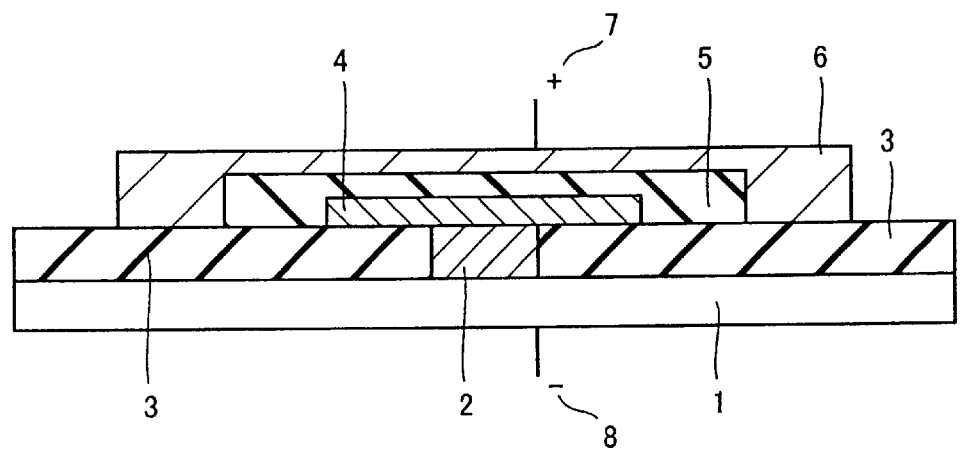
FIG. 1 is a sectional view schematically showing the structure of a semiconductor device having a capacitor according to a first embodiment of the present invention.

Referring to FIG. 1, a capacitor of a semiconductor device according to a first embodiment of the present invention has a storage node (lower electrode) 4, a capacitor dielectric layer 5 and a cell plate (upper electrode) 6.

The storage node 4 is formed by a mixed crystal layer of SiGe containing a p-type impurity (e.g., boron). This storage node 4 is electrically connected to impurity regions for defining source/drain regions formed on a silicon substrate 1 through a plug layer 2. The plug layer 2, filling up a contact hole in an interlayer isolation layer 3, is formed by a silicon film containing a p-type impurity, for example. The interlayer isolation layer 3 is formed by a silicon oxide film, for example. The capacitor dielectric layer 5, covering the storage node 4, is formed by a $Ta_2O_5$ film, for example. The cell plate 6, provided to be opposed to the storage node 4 through the capacitor dielectric layer 5, is formed by a mixed crystal layer of SiGe containing a p-type impurity.

When the capacitor stores information in the aforementioned semiconductor device, a high potential 7 is supplied to the cell plate 6 and a low potential 8 is supplied to the storage node 4.

According to this embodiment, the storage node 4 and the cell plate 6 are formed by the mixed crystal layers of SiGe having a smaller quantity of formation of a depletion layer than silicon. Therefore, the dielectric layer 5 is inhibited from substantial increase of the thickness, and the capacitance of the capacitor can be prevented from reduction. Thus, the capacitor can store sufficient charges.

Further, majority carriers in the cell plate 6 are holes due to the p-type impurity contained in the mixed crystal layer of SiGe forming the cell plate 6 supplied with the high potential 7. Despite the high potential 7 supplied to the cell plate 6, therefore, no depletion layer is formed in the portion of the cell plate 6 in contact with the capacitor dielectric layer 5. Therefore, the thickness of the capacitor dielectric layer 5 is not substantially increased in the junction between the cell plate 6 and the capacitor dielectric layer 5, and hence the capacitor can store sufficient charges.

Second Embodiment

A semiconductor device having a capacitor according to a second embodiment of the present invention is different in structure from the semiconductor device according to the first embodiment shown in FIG. 1 in a point that each of a storage node 4, a plug layer 2 and impurity regions for defining source/drain regions contains an n-type impurity. In other words, the storage node 4 consists of a mixed crystal layer of SiGe containing an n-type impurity (e.g., phosphorus, arsenic or antimony), the plug layer 2 consists of a silicon film containing an n-type impurity, and the impurity regions for defining source/drain regions are n-type impurity regions.

The remaining structure of the second embodiment is substantially identical to that of the aforementioned first embodiment. Therefore, members of the second embodiment identical to those of the first embodiment are denoted by the same reference numerals, and redundant description is not repeated.

When the capacitor stores information in the semiconductor device according to the second embodiment, a high potential 7 is supplied to a cell plate 6 and a low potential 8 is supplied to the storage node 4.

According to this embodiment, majority carriers in the storage node 4 are electrons due to the n-type impurity contained in the storage node 4. Despite the low potential 8 supplied to the storage node 4, therefore, no depletion layer is formed in a portion of the storage node 4 in contact with a capacitor dielectric layer 5.

Further, majority carriers in the cell plate 6 are holes due to a p-type impurity contained in the cell plate 6. Despite the high potential 7 supplied to the cell plate 6, therefore, no depletion layer is formed in a portion of the cell plate 6 in contact with the capacitor dielectric layer 5.

Thus, no depletion layers are formed in both of the storage node 4 and the cell plate 6 and the capacitance of the capacitor is not reduced, whereby the capacitor can store sufficient charges.

Third Embodiment

Figure 2:
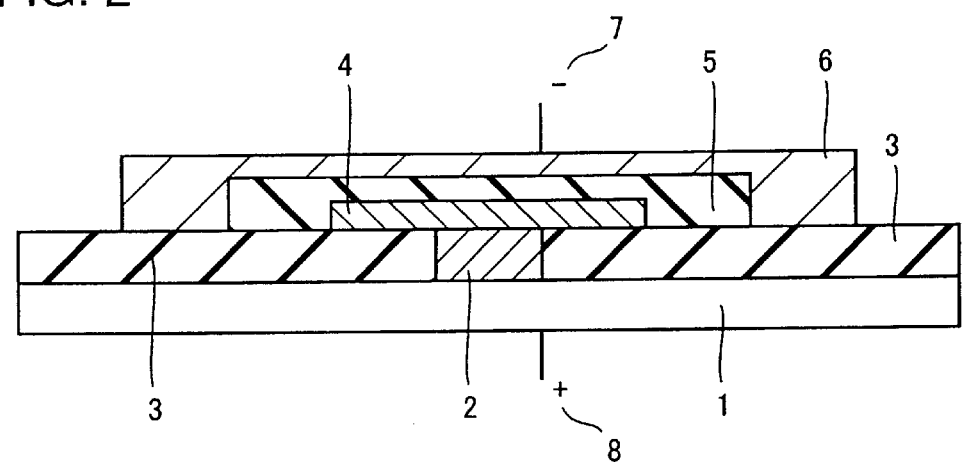
FIG. 2 is a sectional view schematically showing the structure of a semiconductor device having a capacitor according to a third embodiment of the present invention.

Referring to FIG. 2, a semiconductor device having a capacitor according to a third embodiment of the present invention is different in structure from the semiconductor device according to the first embodiment in a point that a cell plate 6 contains an n-type impurity. In other words, the cell plate 6 is formed by a mixed crystal layer of SiGe containing an n-type impurity. When the capacitor stores information, a low potential 7 is supplied to the cell plate 6 and a high potential 8 is supplied to a storage node 4.

The remaining structure of the third embodiment is substantially identical to that of the aforementioned first embodiment. Therefore, members of the third embodiment identical to those of the first embodiment are denoted by the same reference numerals, and redundant description is not repeated.

According to this embodiment, majority carriers in the storage node 4 are holes due to a p-type impurity contained in the storage node 4. Despite the high potential 8 supplied to the storage node 4, therefore, no depletion layer is formed in a portion of the storage node 4 in contact with a capacitor dielectric layer 5.

Further, majority carriers in the cell plate 6 are electrons due to the n-type impurity contained in the cell plate 6. Despite the low potential 7 supplied to the cell plate 6, therefore, no depletion layer is formed in a portion of the cell plate 6 in contact with the capacitor dielectric layer 5.

Thus, no depletion layers are formed in both of the storage node 4 and the cell plate 6 and the capacitance of the capacitor is not reduced, whereby the capacitor can store sufficient charges.

Other Embodiments

In the mixed crystal layers of SiGe forming the storage node 4 and the cell plate 6 in each of the aforementioned first to third embodiments, the mixed crystal ratio of Ge is preferably set to an arbitrary value below 30 atomic percent. Thus, the thicknesses of depletion layers in the cell plate 6 and the storage node 4 can be properly set for preventing the capacitance of the capacitor from reduction. If the mixed crystal ratio of Ge exceeds 30 atomic percent, the quantity of a leakage current is unpreferably increased.

Figure 3:
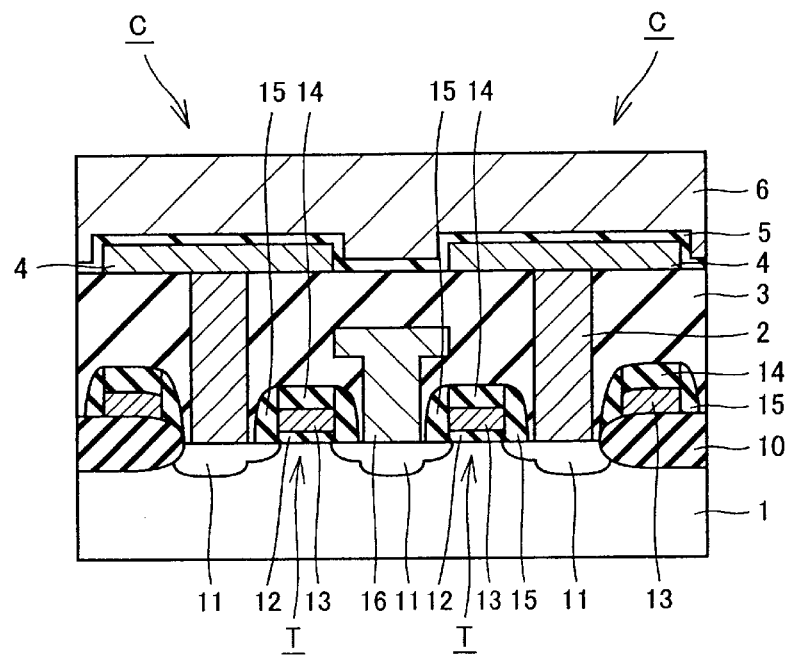
FIG. 3 is a schematic sectional view showing a structure of memory cells of a DRAM to which the capacitor according to each embodiment of the present invention is applied.
Figure 4:
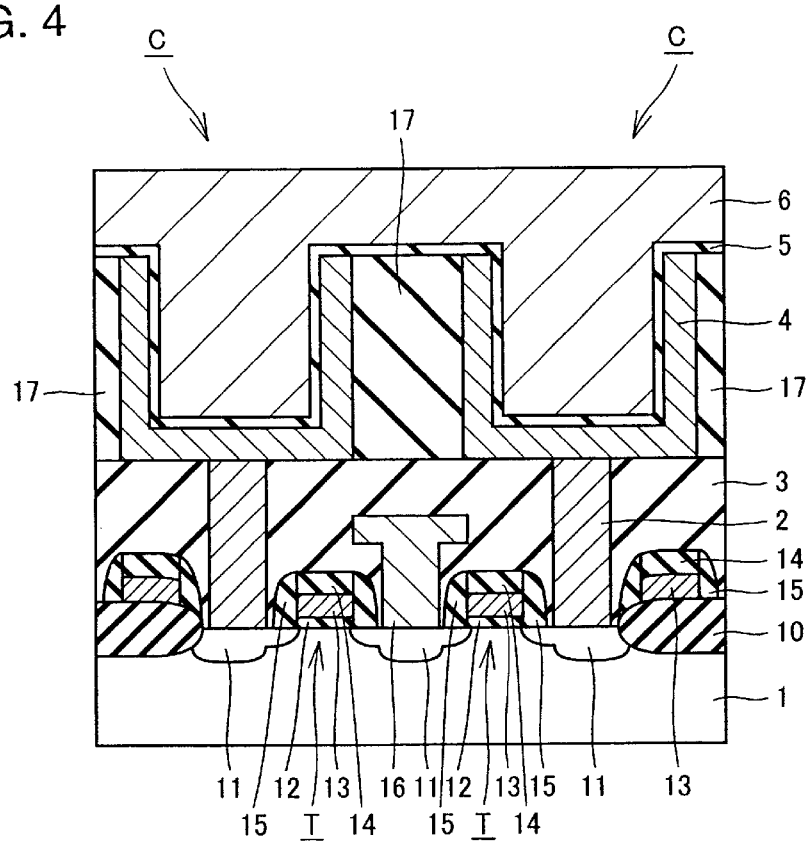
FIG. 4 is a schematic sectional view showing another structure of memory cells of a DRAM to which the capacitor according to each embodiment of the present invention is applied.
Figure 5:
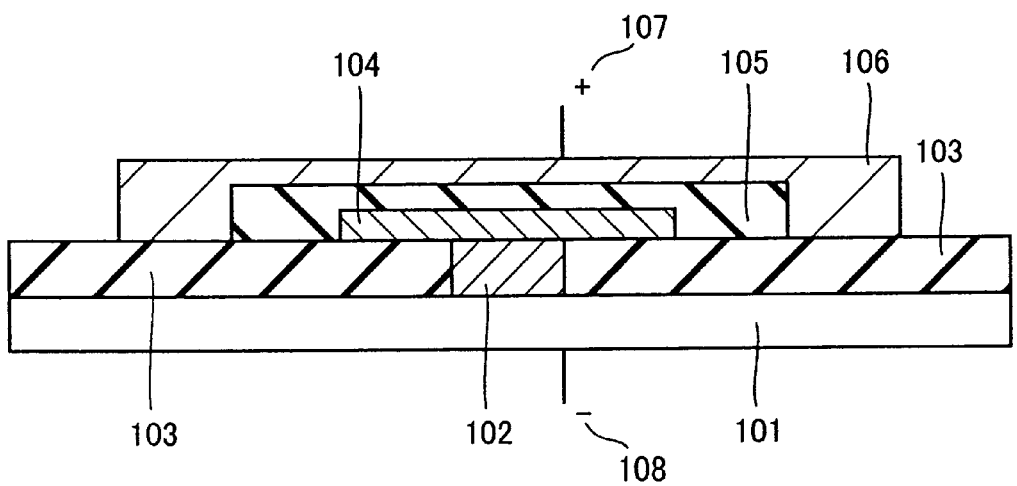
FIG. 5 is a sectional view schematically showing the structure of a conventional semiconductor device having a capacitor.

The capacitor of the semiconductor device according to each of the first to third embodiments may alternatively be applied to a capacitor included in each memory cell of a DRAM in each of structures shown in FIGS. 3 and 4. The structures shown in FIGS. 3 and 4 are now briefly described.

Referring to FIG. 3, each memory cell of the DRAM is formed by a single transistor T and a single capacitor C. The transistor T, formed on a surface part of a silicon substrate 1 electrically isolated by a field oxide film 10, has a pair of source/drain regions 11, a gate insulating layer 12 and a gate electrode 13. The pair of source/drain regions 11 are formed on the surface of the silicon substrate 1 at a distance from each other. The gate electrode 13 is formed on a region held between the pair of source/drain regions 11 through the gate insulating layer 12.

An insulating layer 14 is formed on the gate electrode 13, and side wall insulating layers 15 are formed to cover the side walls of the gate electrode 13 and the insulating layer 14.

A bit line 16 is electrically connected to one of the source/drain regions 11 of the transistor T, while the capacitor C is electrically connected to the other source/drain region 11.

The capacitor C has a storage node 4, a capacitor dielectric layer 5 and a cell plate 6. The storage node 4 is electrically connected to the source/drain regions 11 through a plug layer 2. The cell plate 6 is formed to be opposed to the storage node 4 through the capacitor dielectric layer 5. The plug layer 2 fills up a contact hole in an interlayer isolation layer 3.

The capacitor according to any of the aforementioned first to third embodiments is applied to this capacitor C.

Referring to FIG. 4, this structure is different from that shown in FIG. 3 particularly in the shape of each storage node 4. In this structure, the storage node 4 is formed along the inner walls of a trench in an interlayer isolation layer 17, thereby presenting a cylindrical shape.

The remaining structure shown in FIG. 4 is substantially identical to the aforementioned structure shown in FIG. 3. Therefore, members identical to those shown in FIG. 3 are denoted by the same reference numerals, and redundant description is not repeated.

The capacitor according to any of the aforementioned first to third embodiments is applied to such a capacitor C. The capacitor according to any of the aforementioned first to third embodiments, applied to a DRAM in the above description, may alternatively be applied to a capacitor of an e-RAM (embedded RAM).

In the aforementioned semiconductor device having a capacitor, as hereinabove described, both of the lower electrode and the upper electrode are preferably formed by mixed crystal layers of SiGe containing a p-type impurity. Whichever electrode is supplied with a high potential, therefore, formation of a depletion layer can be prevented in the electrode supplied with the high potential.

In the aforementioned semiconductor device having a capacitor, the lower electrode is preferably formed by a mixed crystal layer of SiGe containing an n-type impurity, and the upper electrode is preferably formed by a mixed crystal layer of SiGe containing a p-type impurity. Thus, when a high potential is supplied to the upper electrode and a low potential is supplied to the lower electrode, formation of a depletion layer can be prevented in the upper electrode formed by the mixed crystal layer of SiGe containing a p-type impurity. Further, majority carriers in the lower electrode formed by the mixed layer of SiGe containing an n-type impurity are electrons. Also when a low potential is supplied to the lower electrode, therefore, no depletion layer is formed in the portion of the lower electrode in contact with the dielectric layer. Thus, both of the lower electrode and the upper electrode can be prevented from formation of depletion layers.

In the aforementioned semiconductor device having a capacitor, the lower electrode is preferably formed by a mixed crystal layer of SiGe containing a p-type impurity, and the upper electrode is preferably formed by a mixed crystal layer of SiGe containing an n-type impurity. Thus, when a high potential is supplied to the lower electrode and a low potential is supplied to the upper electrode, both of the lower electrode and the upper electrode can be prevented from formation of depletion layers.

The aforementioned semiconductor device having a capacitor is preferably so formed as to supply the upper electrode with a potential higher than a potential supplied to the lower electrode. Thus, both of the lower electrode and the upper electrode can be prevented from formation of depletion layers.

The aforementioned semiconductor device having a capacitor is preferably so formed as to supply the lower electrode with a potential higher than a potential supplied to the upper electrode. Thus, both of the lower electrode and the upper electrode can be prevented from formation of depletion layers.

In the aforementioned semiconductor device having a capacitor, the mixed crystal layer of SiGe preferably contains Ge at an arbitrary mixed crystal ratio of not more than 30 atomic percent. Thus, a depletion layer can be set to a proper thickness by varying the mixed crystal ratio of Ge in SiGe forming the electrode, whereby the capacitor can be effectively prevented from reduction of the capacitance. If the mixed crystal ratio of Ge exceeds 30 atomic percent, the quantity of a leakage current is unpreferably increased.

In the aforementioned semiconductor device having a capacitor, the dielectric layer preferably consists of a material including $Ta_2O_5$. Thus, a capacitor having a large capacitance can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a capacitor including a lower electrode and an upper electrode opposed to each other through a dielectric layer, wherein:

at least either said lower electrode or said upper electrode has a mixed crystal layer of SiGe containing a p-type impurity; and said lower electrode is electrically connected to a source/drain region on a substrate through a plug layer formed of an Si film including an impurity of the same type as said lower electrode.

2. The semiconductor device having a capacitor according to claim 1, wherein both of said lower electrode and said upper electrode are formed by mixed crystal layers of SiGe containing a p-type impurity.

3. The semiconductor device having a capacitor according to claim 1, wherein said lower electrode is formed by a mixed crystal layer of SiGe containing an n-type impurity, and said upper electrode is formed by a mixed crystal layer of SiGe containing a p-type impurity.

4. The semiconductor device having a capacitor according to claim 1, wherein said lower electrode is formed by a mixed crystal layer of SiGe containing a p-type impurity, and said upper electrode is formed by a mixed crystal layer of SiGe containing an n-type impurity.

5. The semiconductor device having a capacitor according to claim 3, so formed as to supply said upper electrode with a potential higher than a potential supplied to said lower electrode.

6. The semiconductor device having a capacitor according to claim 4, so formed as to supply said lower electrode with a potential higher than a potential supplied to said upper electrode.

7. The semiconductor device having a capacitor according to claim 1, wherein said mixed crystal layer of SiGe contains Ge at an arbitrary mixed crystal ratio of not more than 30 atomic percent.

8. The semiconductor device having a capacitor according to claim 1, wherein said dielectric layer consists of a material including $Ta_2O_5$.

* * * * *

UNITED STATES PATENT AND TRADEMARK OFFICE
CERTIFICATE OF CORRECTION

PATENT NO. : 6,707,091 B2  Page 1 of 1
DATED : August 5, 2002
INVENTOR(S) : Kazuhiro Aihara It is certified that error appears in the above-identified patent and that said Letters Patent is hereby corrected as shown below:

<u>Title page,</u>
Item [73], Assignee, should read,-- Renesas Technology Corp., Tokyom Japan. --.

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,707,091 B2
DATED          : March 16, 2004
INVENTOR(S)    : Kazuhiro Aihara It is certified that error appears in the above-identified patent and that said Letters Patent is hereby corrected as shown below:

<u>Title page,</u>
Item [73], Assignee, change "Mitsubishi Denki Kabushiki Kaisha, Tokyo (JP)" to
-- Renesas Technology Corp., Tokyo (JP) --

Signed and Sealed this

Third Day of August, 2004

JON W. DUDAS
*Acting Director of the United States Patent and Trademark Office*